United States Patent
Zhao et al.

(10) Patent No.: US 12,204,287 B2
(45) Date of Patent: Jan. 21, 2025

(54) MULTI-CHAIN MEASUREMENT CIRCUIT

(71) Applicant: Apple Inc., Cupertino, CA (US)

(72) Inventors: Bo Zhao, Cupertino, CA (US); Joao Pedro da Silva Cerqueira, Sunnyvale, CA (US); Pangjie Xu, San Jose, CA (US); Steven Lu, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 71 days.

(21) Appl. No.: 17/816,894

(22) Filed: Aug. 2, 2022

(65) Prior Publication Data

US 2024/0045382 A1 Feb. 8, 2024

(51) Int. Cl.
| | | |
|---|---|---|
| *H03M 1/50* | (2006.01) | |
| *G01R 19/255* | (2006.01) | |
| *G04F 10/00* | (2006.01) | |
| *H03M 1/08* | (2006.01) | |

(52) U.S. Cl.
CPC ......... *G04F 10/005* (2013.01); *G01R 19/255* (2013.01); *H03M 1/0836* (2013.01)

(58) Field of Classification Search
CPC .......... H03M 1/50; H03M 1/502; H03M 1/12; H03M 1/1009; H03M 1/1205; H03M 1/1215; G04F 10/005; G04F 10/06; G04F 10/10; H03L 7/0814; H03L 7/085; H03L 2207/50; H03L 7/091; H03L 7/099; H03L 7/0995; H03K 5/135; H03K 5/14; H03K 5/133
USPC .......................................... 341/111, 155, 160
See application file for complete search history.

(56) References Cited

U.S. PATENT DOCUMENTS

| | | | |
|---|---|---|---|
| 5,533,072 A | 7/1996 | Georgiou et al. | |
| 7,884,751 B2 * | 2/2011 | Shimizu | G04F 10/06 341/166 |
| 7,893,861 B2 * | 2/2011 | Bulzacchelli | H03M 1/20 341/166 |
| 8,159,272 B2 * | 4/2012 | Chatterjee | G01R 31/31709 327/31 |
| 8,242,823 B2 * | 8/2012 | Le | H03K 5/131 327/284 |
| 8,471,736 B1 * | 6/2013 | Booth | G04F 10/005 327/158 |

(Continued)

FOREIGN PATENT DOCUMENTS

CN 1449119 A 10/2003

OTHER PUBLICATIONS

International Search Report and Written Opinion in PCT Appl. No. PCT/US2023/025671 mailed Dec. 26, 2023, 8 pages.

(Continued)

*Primary Examiner* — Linh V Nguyen
(74) *Attorney, Agent, or Firm* — Kowert, Hood, Munyon, Rankin & Goetzel, P.C.; Dean M. Munyon

(57) ABSTRACT

A multi-chain measurement circuit is disclosed. The measurement circuit includes first and second chains of serially-connected buffer circuits coupled in parallel, each of which propagates an input signal. A set of storage circuits is configured to store logic values generated by the first and second sets of buffer circuits in response to the transitioning of a clock signal. The logic values stored in the storage circuits result in a digital value indicative of a total number of serially-connected storage circuits through which the input signal has propagated at the time of the transition of the operating clock signal.

20 Claims, 7 Drawing Sheets

(56) References Cited

U.S. PATENT DOCUMENTS

| | | | |
|---|---|---|---|
| 8,471,754 B2* | 6/2013 | Yamamoto | G04F 10/10 |
| | | | 341/166 |
| 9,047,934 B1 | 6/2015 | Ng et al. | |
| 9,098,072 B1 | 8/2015 | Waltari | |
| 9,191,147 B1* | 11/2015 | Sheahan | H03M 1/0624 |
| 9,490,831 B2* | 11/2016 | Kim | G04F 10/005 |
| 9,746,832 B1* | 8/2017 | Yao | H03M 1/50 |
| 11,031,945 B1 | 6/2021 | Maltabas et al. | |
| 11,036,253 B1 | 6/2021 | Paternoster et al. | |
| 2006/0103566 A1* | 5/2006 | Vemulapalli | G04F 10/005 |
| | | | 341/155 |
| 2009/0116312 A1 | 5/2009 | Carpenter et al. | |
| 2009/0219187 A1* | 9/2009 | Sun | G04F 10/005 |
| | | | 341/166 |
| 2013/0214831 A1 | 8/2013 | Park et al. | |
| 2020/0328755 A1* | 10/2020 | Todorokihara | H03M 1/1245 |
| 2020/0389159 A1 | 12/2020 | Ware et al. | |
| 2020/0395849 A1 | 12/2020 | Labbe et al. | |
| 2021/0242872 A1 | 8/2021 | Bang et al. | |
| 2021/0320668 A1* | 10/2021 | Todorokihara | H03M 1/1245 |

OTHER PUBLICATIONS

Office Action in Taiwanese Appl. No. 112128965 mailed May 8, 2024.

* cited by examiner

MULTI-CHAIN MEASUREMENT CIRCUIT

BACKGROUND

Technical Field

This disclosure is related to electronic circuits, and more particularly, electronic circuits for performing measurements.

Description of the Related Art

Measurement circuits such as time-to-digital converters (TDCs) are used in a number of different applications. A TDC may measure the amount of time elapsed from the occurrence of a particular event and convert that time into a digital value. One example application of a TDC is voltage droop detection, wherein a supply voltage has fallen below some specified level is detected.

A TDC typically includes a chain of delay elements with corresponding storage elements. An input signal indicating the beginning of an event may propagate through the chain of delay elements, while, in response to a clock signal, the storage elements may capture respective output values from the delay elements. An output word, indicated by the aggregated values stored in the various storage elements, may include a number of consecutive logic values (e.g., logic ones) followed by a number of consecutive complementary logic values (e.g., logic zeros). The resulting output word may indicate the amount of time for which the particular event has occurred.

SUMMARY

A multi-chain measurement circuit is disclosed. In one embodiment, a measurement circuit includes a first delay circuit having a first set of serially-connected buffer circuits, wherein the first set of buffer circuits are configured to propagate an input signal, and a second delay circuit connected in parallel with the first delay circuit, the second delay circuit including a second set of serially-connected buffer circuits configured to propagate the input signal. The measurement circuit further includes a set of storage circuits configured to store logic values produced by the first and second sets of buffer circuits in response to a transition of an operating clock signal. The measurement circuit is configured to use the logic values stored in the set of storage circuits to output a digital value indicative of a total number of serially-connected buffer circuits of the first and second sets of buffer circuits through which the input signal has propagated at a time of the transition of the operating clock signal.

In one embodiment, the measurement circuit is a time-to-digital converter (TDC). The TDC may include first and second delay chains, which are coupled to various ones of a number of storage elements, such as flip-flop circuits. The flip-flop circuits may capture a digital value in response to a clock signal, with the digital value indicating a number of serially-coupled buffer circuits of the first and second delay chains through which an input signal has propagated. The use of multiple delay chains may allow for a wider dynamic range and increased granularity of measurements performed by the circuit. Additionally, the use of multiple delay chains may also allow for a smaller measurement delay and a higher measurement throughput. In one embodiment, the TDC may be used in a voltage droop detection circuit to detect droops in a supply voltage, allowing a power management circuit to take corrective actions.

BRIEF DESCRIPTION OF THE DRAWINGS

The following detailed description makes reference to the accompanying drawings, which are now briefly described.

DETAILED DESCRIPTION OF EMBODIMENTS

Figure 1:
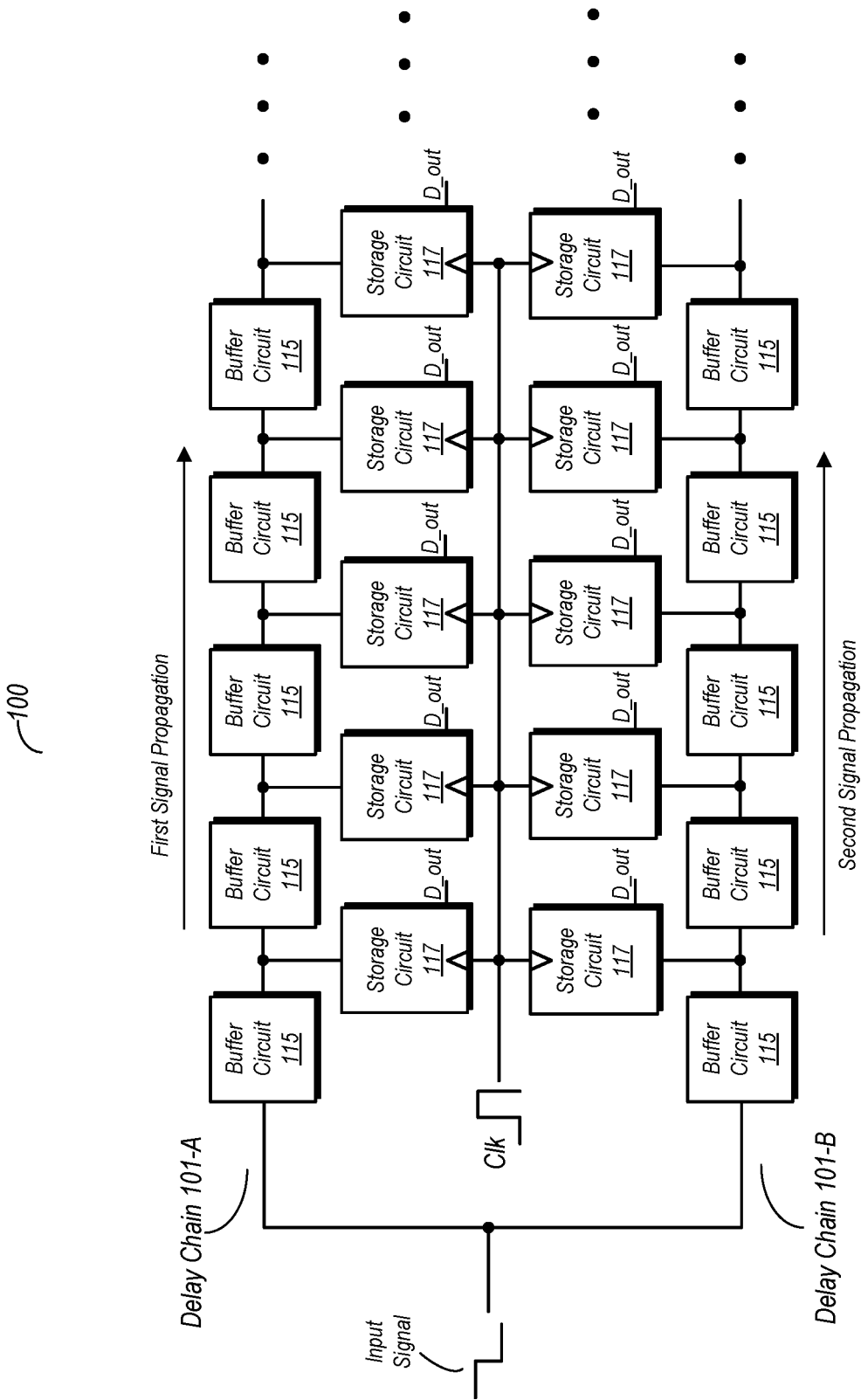
FIG. 1 is a block diagram of one embodiment of a measurement circuit.

The present disclosure is directed to a measurement circuit, such as a time-to-digital converter (TDC). Measurement circuits such as TDCs are used in a number of different applications, such as voltage droop detection. In such circuits, it is often desirable to have a wider dynamic range and better measurement granularity. This may be obtained by using longer delay chains. However, the longer delay chains have greater propagation delay, which limits attainable dynamic range and measurement granularity, and thus limits systems that utilize these circuits.

The present disclosure makes use of the insight that having multiple chains operating in parallel could allow an input signal to propagate through more delay elements in a given amount of time relative to single-chain embodiments. For example, the disclosure contemplates a dual-chain TDC as a measurement circuit. The delay chains comprise delay circuits each having a number of serially-coupled buffers (e.g., inverters) that receive a common input signal. The signals propagating through the delay chains may be complementary to one another but aligned in time. Upon receiving the input signal, versions thereof are concurrently propagated through the delay chains. Upon the transitioning of a clock signal, storage circuits coupled to the delay chains may capture and hold the output states of various ones of the serially-coupled buffers. The output states may be provided to, e.g., a register, and may form a digital word that corresponds to the value of the measurement.

Different configurations, such as an odd-even configuration and a true-complement configuration are possible and contemplated. Additionally, embodiments using flip-flop circuits with multiple clock inputs are also possible and contemplated. In such embodiments, the flip-flops may operate in accordance with a clock received via clock node in which all are clocked at approximately the same time, or may operate based on a clock signal received from a vernier clock circuit. When operating using the vernier clock signal, an effective stage delay is the difference between the stage delay of the delay chains through which the input signal is propagated and delay chains through which the vernier clock signal is propagated. The delay chains of the vernier clock circuit are designed such that the vernier clock signal propagates faster than the delay chains through which the input signal is propagated. But making the vernier clock delay chains faster, the effective stage delay is faster than a gate delay of the data chain. As a result, even more resolution can be obtained.

Thus, a multi-chain measurement circuit as disclosed herein may offer higher resolution than a single chain circuit (e.g., such as a single chain TDC). The higher resolution may in turn allow for faster sampling rates, and thus more frequent measurements.

The dual-chain design of the present disclosure may also reduce dead time. In a single-chain design, only the rising signal propagation is used, and thus the chain needs to be reset prior to the next measurement. In contrast, the dual-chain design disclosed herein may use both the rising and falling propagations in alternating operation, e.g., rising during the first operation and falling during the next operation, and so on, and thus does not incur the dead time of a single-chain design. Single-chain designs may have a rising-falling asymmetry, as the rising propagation distance may be different from the falling propagation distance as a result of circuit variations, PMOS/NMOS asymmetry, and so on. In the dual-chain design, the two chains are designed to by symmetric and complementary with respect to one another. Accordingly, in the dual-chain design, the rising and falling transitions between the two chains occur in a symmetric and complementary fashion, e.g., the signal rises at the output of one inverter in a first chain and falls in a corresponding inverter in the second chain at substantially the same time. Accordingly, there is no rising/falling asymmetry in the dual-chain design.

A more detailed discussion of the present disclosure begins with a general embodiment of a multi-chain measurement circuit in FIG. 1, followed by discussions of odd/even and true/complement embodiments. A block diagram of a system using an embodiment of the measurement circuit as disclosed herein in a voltage droop detection circuit is then described. Following this, various method embodiments for operating a measurement circuit are described in reference to flow diagrams. The discussion concludes with a description of an example system that may include instances of the measurement circuit as disclosed herein.

Multi-Chain Measurement Circuit Embodiments:

FIG. 1 is a diagram of one embodiment of a multi-chain measurement circuit. In the embodiment shown, measurement circuit 100 includes a first delay chain 101-A having a first plurality of serially-coupled buffer circuits 115, and a second delay chain 101-B having a second plurality of serially-coupled buffer circuits 115. Although not explicitly shown here, one of the delay chains 101 may be offset in delay (e.g., by one gate delay) with respect to the other one to produce signals in the delay chains that are complementary but aligned with one another.

Figure 2:
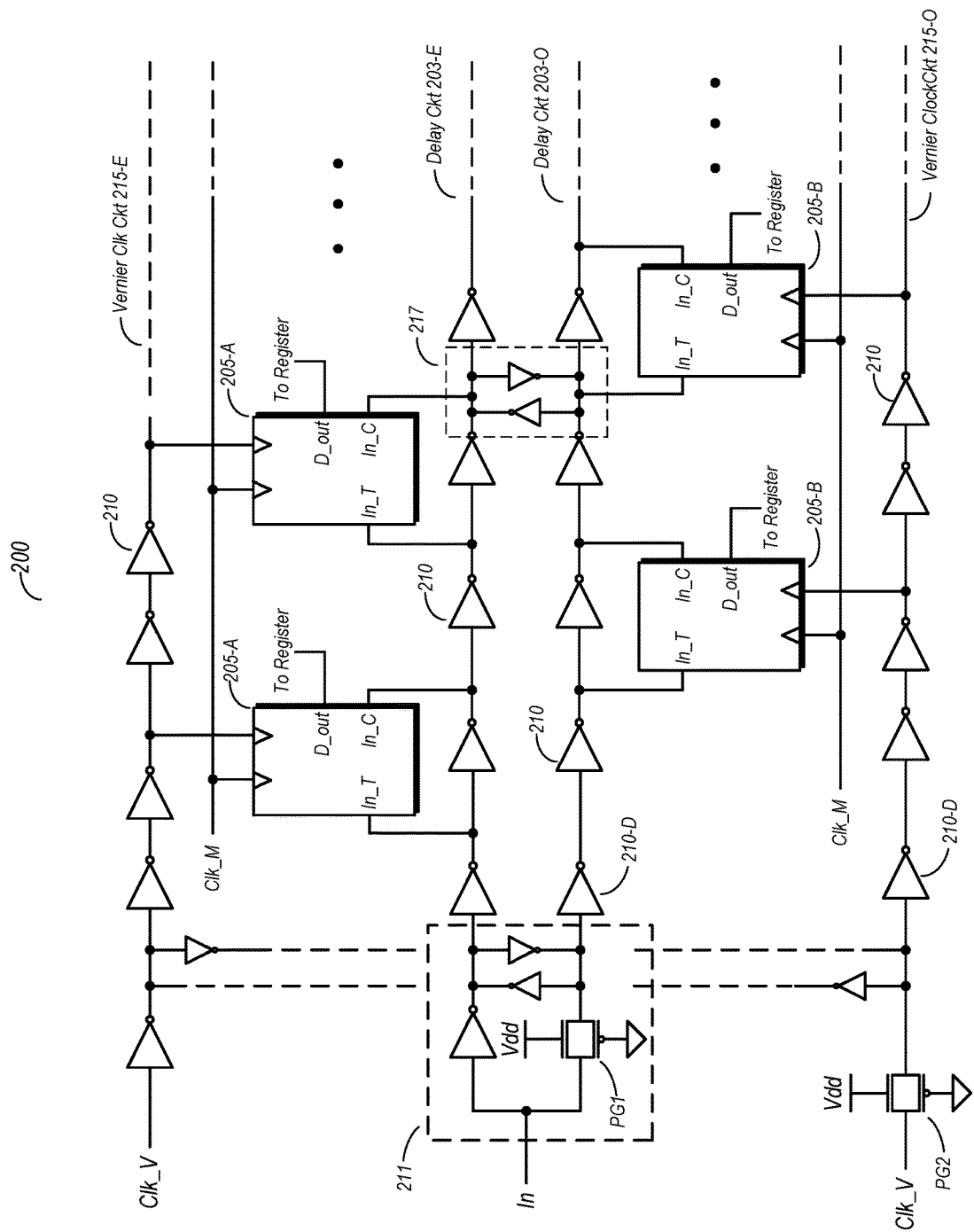
FIG. 2 is a diagram of one embodiment of a time-to-digital converter (TDC) having multiple delay chains.
Figure 3:
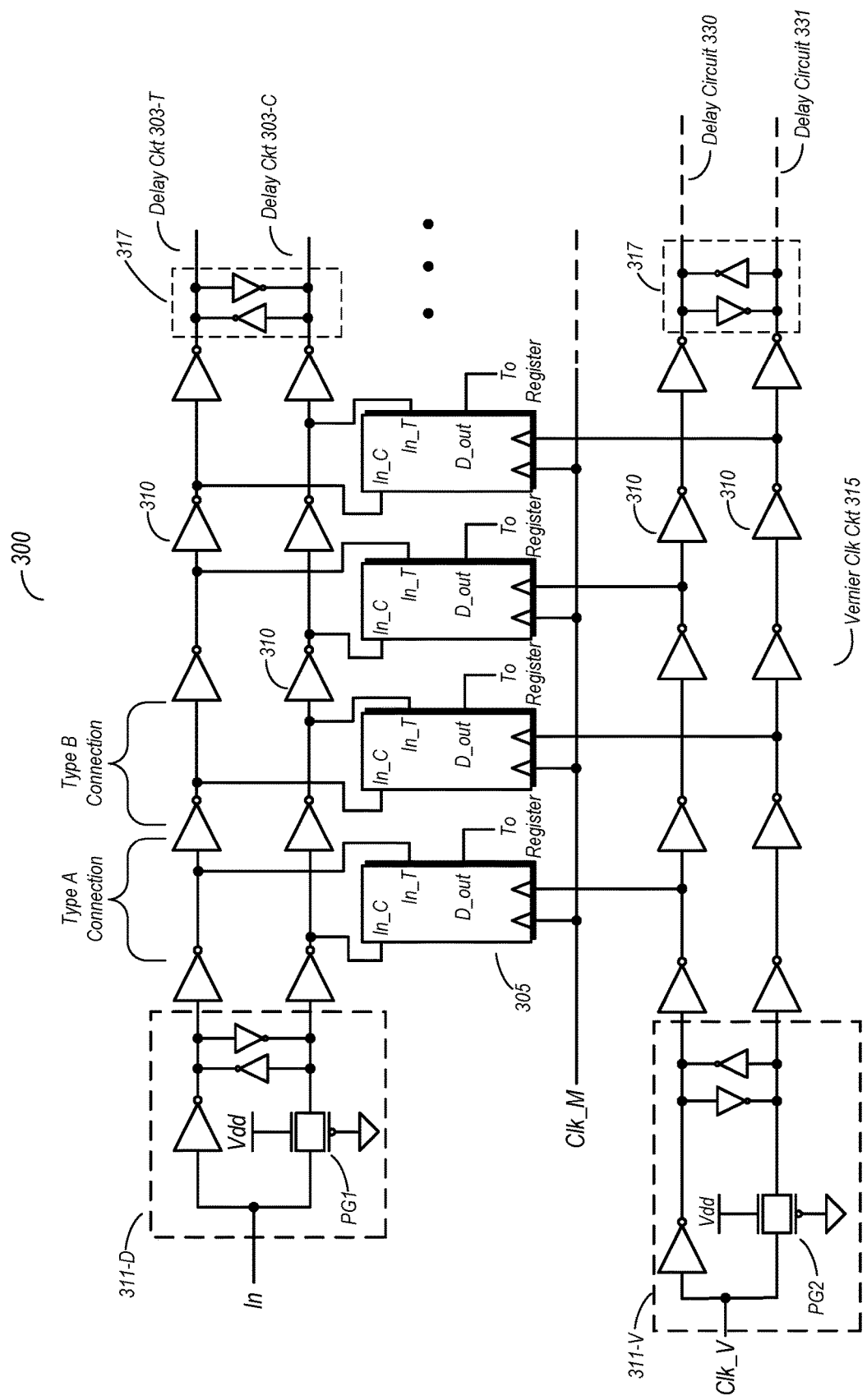
FIG. 3 is a diagram of another embodiment of a TDC having multiple delay chains.

An output of each of the buffer circuits 115 is coupled to an input of a corresponding storage circuit 117, which may be implemented using flip-flops, latches, or other suitable storage circuit type. In one embodiment, as shown in FIG. 2, some storage circuits 117 are coupled to only one of the delay chains while other storage circuits 117 are coupled to the other delay chain. In another embodiment, as shown in FIG. 3, each storage circuit 117 includes a true input coupled to one of the delay chains and a complementary input coupled to the other delay chain. When a signal is input into the delay chains 101, a corresponding first signal propagates through delay chain 101-A while a second signal propagates through delay chain 101-B from one buffer circuit 115 to the next. As noted above, one of these signals may be a delayed version of the other. When the clock signal (Clk) toggles to an active state, output states of the various buffer circuits 115 are captured in correspondingly coupled ones of storage circuits 117. The outputs (D_out) of the storage circuits 117 may be coupled to a register or other type of memory, which may receive the captured values. The captured values form a data word that corresponds to the measurement taken by the measurement circuit.

The measurement circuit 100 may be used in a variety of applications. In one embodiment to be discussed in further detail below, measurement circuit 100 may be operated as a TDC that is used to detect voltage droops from a supply voltage. Power management circuitry may use the indication of a voltage droop to take corrective action to return the supply voltage to within prescribed limits.

Other applications of measurement circuit 100 are also possible and contemplated. For example, the use of the circuit to measure clock skew is possible and contemplated. A first clock signal may be provided as the input signal, while a second clock signal is provided to the storage circuits as a capture signal. This may allow measurement of the skew between the first and second clock signals in terms of the number of buffer circuits through which the first clock signal propagates. The measurement of duty cycle distortion is another possible application of the circuit. The input signal may come from the falling edge of a clock signal, while the storage elements may be triggered by the rising edge of the same clock signal, with the circuit measuring the width of the low phase of the clock signal in terms of the number of buffer circuits through which it propagates. It is noted that these two examples are not intended to be limiting, and other applications may also be possible.

FIG. 2 is a block diagram of another embodiment of a measurement circuit. In the embodiment shown, measurement circuit 200 is arranged in an odd/even configuration, and includes two delay chains. Delay circuit 203-E is the even chain in this embodiment, while delay circuit 203-O is the odd chain. In this particular embodiment, the buffers are implemented as inverters 210. Measurement circuit 200 also includes a number of storage circuits 205, implemented here as flip-flops having a differential input. The inputs of storage circuits 205-A are coupled to delay circuit 203-E, while the inputs of storage circuits 205-B are coupled to delay circuit 203-O. Each of the storage circuits 205-A and 205-B in this embodiment include two different clock inputs, and may operate in accordance with one of the clocks depending on a particular mode of operation. In a normal mode of operation, a first clock signal Clk_M may be provided to the clock inputs of the storage circuits 205-A and 205-B, respectively. In a vernier mode of operation, the clock signal, Clk_V, may be received by the storage circuits 205-A and 205-B from a vernier clock circuit 215. In the embodiment shown, the vernier clock circuit 215 is divided into two branches, 215-E (for the even portion of the circuit) and 215-O (for the odd portion of the circuit). Measurement circuit 200 in the embodiment shown also includes an edge aligner 211 that is coupled to receive the input signal and configured to generate two complementary and aligned signals. Additionally, one or more inverter pairs may be coupled between delay circuit 203-E and 203-O (as well as between 215-E and 215-O).

As noted above, storage circuits 205 in the embodiment shown are implemented as differential flip-flops, each having a true and complementary inputs. With respect to a given one of the inverters 210 in a corresponding delay circuit 203, each of the storage circuits 205 has a true input coupled to the input of a buffer circuit 210 and a complementary signal coupled to the output of the same buffer circuit 210. Accordingly, each of the storage circuits 205 is arranged to capture both the input and output states of a correspondingly coupled inverter 210. Each of the storage circuit 205 in the embodiment shown includes an output, D_out, that may be coupled to a register.

Delay circuits 203-E and 203-O are arranged to propagate signals through their buffer with a delay applied to the former with respect to the latter. In this embodiment, this delay is accomplished by edge aligner circuit 211, which includes one instance of an inverter 210 and a passgate PG1. The input signal may propagate into a first inverter 210 of delay circuit 203-O, through the passgate. In the even chain, the edge aligner circuit 211 includes an inverter coupled to delay circuit 203-E, which causes generation of a signal that is complementary but aligned in time with the signal in the odd chain. The odd chain includes inverter 210-D, which causes the odd chain to start one inverter delay later than the even chain.

Due to possible circuit mismatches between the two delay chains, one or more instances of an inverter pair 217 is coupled between delay circuit 203-E and 203-O (this also applies to delay chains 215-E and 215-O of the vernier clock circuit). The actual number of inverter pairs 217 coupled between delay circuits 203-E and 203-O may vary from one embodiment to the next. While it is possible that an inverter pair 217 be coupled between each of the inputs/outputs of corresponding inverters 210 in the delay circuits, various embodiments having fewer inverter pairs 217 are possible and contemplated, including that which is shown in FIG. 2. The exact number of inverter pairs 217 may be implemented at a number that is sufficient to reduce the mismatch between the delay chains to a negligible amount across process, voltage, and temperature variations, and to enforce the complementary and aligned signals in one delay chain with respect to the other.

In a first mode of operation, measurement circuit 200 operates in accordance with a clock signal conveyed on the clock node Clk_M. When the clock signal transitions from an inactive state to an active state, each of the storage circuit 205-A and 205-B receive the transition at substantially the same time. Thus, the values of the inverter outputs in both delay circuits 203-E and 203-O are captured at substantially the same time.

The output values captured by storage circuits 205-A and 205-B form a data word that may indicate how far the input signal has propagated. For example, a data word may include a string of logic ones followed by a string of logic zeros (e.g., 1111100000, which is a thermometer code). The point in the word where the last logic one meets the first logic zero is thus indicative of the distance through the delay circuits 203-E and 203-O which the input signal has propagated. This value can also indicate an amount of time since the beginning of an event. For example, when measurement circuit 200 is used in a voltage droop detection circuit, a large number of logic ones followed by a small number of logic zeros may indicate that no voltage droop has occurred, while a small number of logic ones followed by a large number of logic zeros may indicate that a voltage droop has occurred and that some corrective action is needed.

By using the two different delay circuits 203-E and 203-O in the illustrated embodiment, with iso-latency, the resolution of the performed measurement may be effectively doubled over a similar circuit in which only a single delay chain/circuit is used. Thus, in the example in which measurement circuit 200 is used as a TDC, the precision of the measurement may be twice that of a single delay chain embodiment.

Further improvement in the resolution may be obtained when operating in a vernier clock mode. In the vernier mode, a clock signal, Clk_V is provided to corresponding inputs of the storage circuits 205 via a vernier circuit 215, which is shown here in branches 215-E and 215-O, although it is to be understood that these branches are part of the same circuit. It is noted that the Clk_M signal is inhibited during this mode of operation, just as Clk_V is inhibited when operating in the first mode (when Clk_M is operating). The vernier circuit 215 includes an extra inverter and a passgate PG2 that form an edge aligner circuit that functions similarly to that of edge aligner circuit 211 described above. Additionally, one or more inverter pairs are coupled between the separate branches of vernier circuit 215. The use of edge alignment circuitry may ensure that the vernier clock signal is complementary and aligned between the two chains 215-E and 215-O, while the use of the inverter pairs 217 coupled between the delay chains may help maintain the alignment between the two chains of vernier clock circuit 215.

In contrast with operation based on the Clk_M clock signal, operation in the vernier mode results in the various storage elements capturing respective states of correspondingly coupled inverters 210 in delay chains 203-E and 203-O at different times. Since the delay chains of the vernier clock circuit 215 include inverters 210 to provide delay, each successive storage circuit 205 receives a transition to the active clock state two inverter delays later than the previous storage circuit 205 in the illustrated embodiment. Accordingly, the storage circuits 205 are triggered by a clock transition on a one-by-one basis. In one embodiment, the delay chains of vernier circuit 215 are arranged such that the vernier clock signal propagates faster than the input signal propagates through the delay chains of delay circuit 203. Due to this difference in propagation speeds, the effective stage delay between the inverters 210 can be faster than a normal gate delay, as the effective stage delay is the difference between the stage delay of delay chains in delay circuit 203 and the stage delay of the inverters 210 in the delay chains of vernier clock circuit 215. As a result, greater resolution may be obtained when operating in the vernier mode, as the resolution when operating according to the clock signal Clk_M is based solely on the stage element delay of the inverters in delay circuit 203.

It is noted, that the vernier clock circuit 215 is optional, and embodiments in which sufficient resolution to meet design goals can be provided by the stage delay of inverters in the delay circuit may dispense with the vernier clock circuit 215.

FIG. 3 is a diagram of another embodiment of a measurement circuit. In the embodiment shown, measurement circuit 300 is implemented in what may be referred to as a true/complement embodiment. Measurement circuit 300 includes a delay circuit 303 that is divided into delay circuit 303-T and delay circuit 303-C. A number of storage circuits 305 have differential inputs, one true and one complementary. The storage circuits 305 each include one input coupled to delay circuit 303-T and another input coupled to delay circuit 303-C. The storage circuits 305 are connected to delay circuit 303 in an alternating fashion between the illustrated Type A connection and the Type B connection. In the Type A connection, a storage circuit 305 has a true input (In_T) coupled to delay circuit 303-T and a complementary input (In_C) coupled to delay circuit 303-C. In a Type B connection, a storage circuit 305 has a true input coupled to delay circuit 303-C and a complementary input coupled to delay circuit 303-T.

Each of the storage circuits 305 includes first and second clock inputs to receive the Clk_M or Clk_V signals, respectively. Only one of these clocks operate at any given time, depending on the current mode of operation. When the Clk_M signal is provided as the operating clock, each of the storage circuits 305 is triggered to capture data values at substantially the same time. When operating in the vernier clock mode, the storage circuits 305 are triggered one by one, in an alternation fashion, e.g., a Type-A-connected storage circuit 305, followed by a Type-B-connected storage circuit 305, then another Type-A-connected storage circuit 305, and so on.

The true/complement topology of measurement circuit 300 may also be defined by the manner a vernier clock circuit is connected in embodiments that include one. In the embodiment shown, vernier clock circuit 315 includes a first delay circuit 330 and a second delay circuit 331. The vernier clock inputs of storage circuits 305 having a Type A connection are coupled to receive a vernier clock signal from delay circuit 330. The vernier clock inputs of storage circuits 305 having a Type-B connection are coupled to receive the vernier clock signal from delay circuit 331.

Both the delay circuit 303 and vernier clock circuit 315 include a respective edge aligner circuit 311 on their respective front end. These edge aligner circuits 311-D and 311-V may perform the same functions as their counterparts discussed above in reference to FIG. 2. In particular, the edge aligner circuits 311-D and 311-V may ensure that complementary and aligned signals are propagated through the respectively coupled delay chains.

Additionally, both delay circuit 303 and vernier clock circuit 315 in the embodiment shown includes one or more inverter pairs 317 to compensate for mismatches between their respective delay chains. In providing such compensation, these inverter pairs may enforce that signals remain complementary and aligned between the delay chains.

Figure 4:
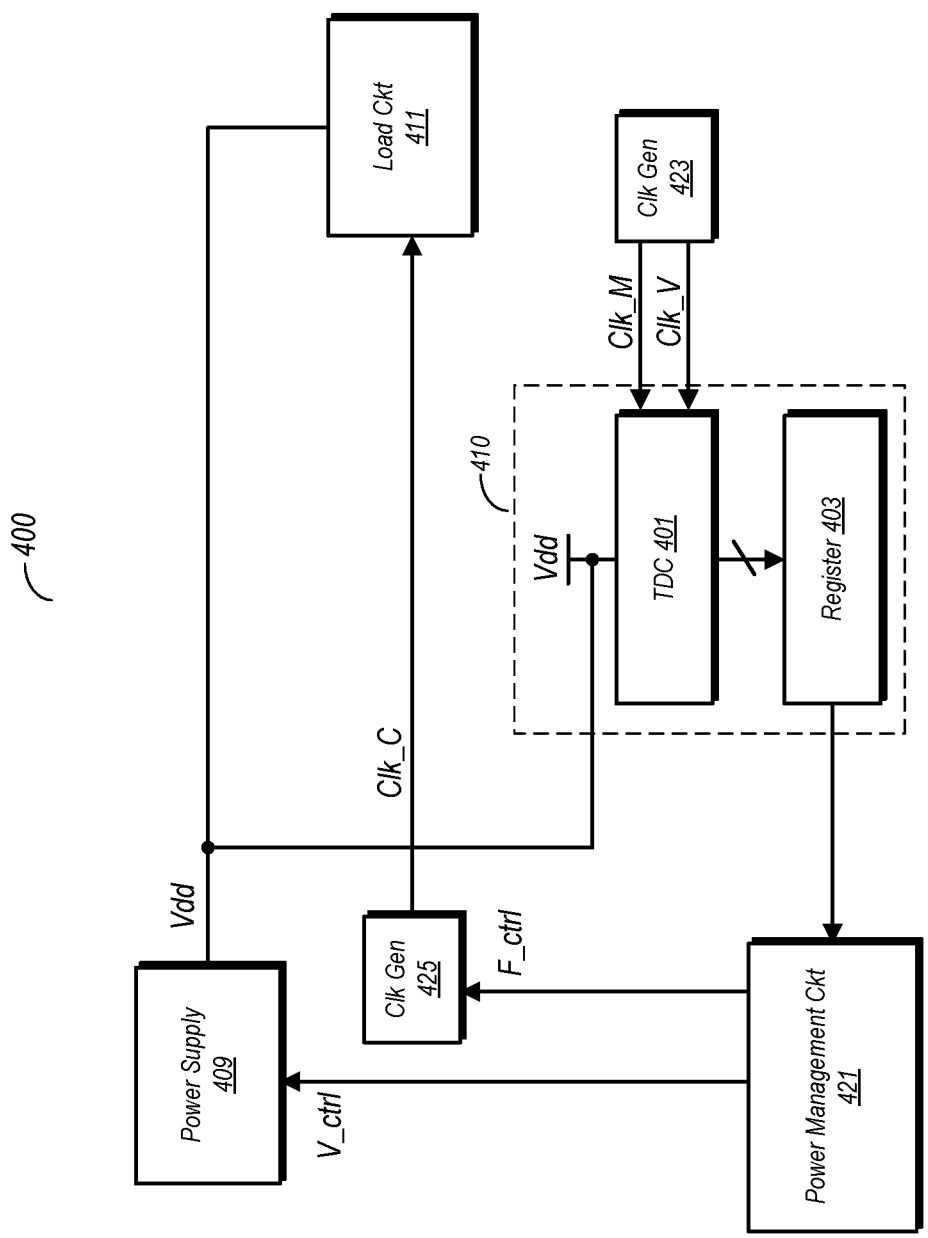
FIG. 4 is a diagram of one embodiment of a system that utilizes a TDC to detect voltage droops.

System Utilizing Measurement Circuit as TDC for Voltage Droop Detection:

FIG. 4 is a block diagram of one embodiment of a system that includes a voltage droop detection circuit that utilizes an embodiment of the measurement circuit disclosed herein in the role of a TDC for detecting voltage droops. In the embodiment shown, system 400 includes a power supply 409 that provides a supply voltage Vdd to a load circuit 411. The load circuit 411 may include analog, digital, and/or mixed signal circuitry. Power supply 409 in the embodiment shown may be one of a number of different types of power converters, including various types of linear voltage regulators or switching regulators. For example, power supply 409 may be a buck regulator that generates Vdd based on an input voltage and performs switching in pulse frequency modulation (PFM) and pulse width modulation (PWM) modes to match the output current to a current demanded by the load circuit 411. Additionally, embodiments are possible and contemplated in which the supply voltage Vdd is variable depending on a performance state in which the load circuit is operating.

In the embodiment shown, load circuit 411 is coupled to receive a clock signal, Clk_C, from a clock generator 425, which may be implemented using any suitable clock generation circuitry. In some embodiments, the frequency of the Clk_C signal may be variable to, e.g., conform to a particular operating state, similar to the supply voltage Vdd. For example, when higher performance is demanded, the voltage and frequency of Vdd and Clk_C, respectively, may be increased. These values being reduced at times of low performance demand or when power savings is prioritized. The particular voltage of Vdd and particular frequency of Clk_C may be controlled using the V_ctrl and F_ctrl signals, respectively, as generated by power management circuit 421.

System 400 in the embodiment shown includes a voltage droop monitor 410, which includes an embodiment of a measurement circuit as disclosed herein implemented as TDC 401. In the embodiment shown, TDC 401 is coupled to receive a supply voltage Vdd that is same supply voltage provided to the load circuit 411 in order to allow detection of a voltage droop caused by the latter. Clock generator 423 in the embodiment shown is configured to generate both the Clk_M and Clk_V signals provided to TDC 401, and may also select the mode of operation by providing one of these signals at a time. In some embodiment, clock generator 423 may be coupled to clock generator 425, and thus clock signals generated by the former may have a dependency on Clk_C. In some embodiments, power management circuit 421 may communicate with clock generator 423 to request or select a particular mode of operation.

TDC 401 in the embodiment shown is coupled to monitor the supply voltage Vdd. One of the two clock signals is provided from clock generator 423, causing TDC 401 to periodically capture values, as described for the various embodiments above. These values are provided to register 403 to form a data word that is then forwarded to power management circuit 421. If the supply voltage Vdd remains within prescribed limits, the data word may be largely or completely unchanged from cycle to cycle. However, if a voltage droop occurs, the value of the data word may change significantly relative to the value generated when Vdd is within prescribed limits. When this occurs, power management circuit 421 may detect the change in the value of the data word and may perform various actions to correct the droop. For example, power management circuit 421 may, using the F_ctrl signal, reduce the frequency of Clk_C, or may inhibit that clock signal altogether for some amount of time. This may reduce the current consumption by load circuit 411, thereby allowing the voltage Vdd to recover to within prescribed limits. Power management circuit 421 may also, or alternatively, change an operating mode of power supply 409 to increase its output current. For example, power management circuit 421 may cause power supply 409 to increase the switching frequency of a buck converter operating in the PFM mode, or increase the pulse width if operating in the PWM mode. Generally speaking, power management circuit 421 may take any suitable action that results in recovery of the supply voltage Vdd to its intended value in response to receiving an indication of a voltage droop from voltage droop detection circuit 410.

Since TDC 401 in the embodiment shown is based on an embodiment of a measurement circuit as disclosed herein, it may be able to carry out measurements with higher resolution than embodiments of a TDC that, e.g., rely on a single delay chain. As a result of the multiple delay chains, an input signal may propagate through a greater number of buffer circuits (e.g., inverters) than would be possible using a single delay chain. This may allow for faster detection of a voltage droop, and thus, a faster response in beginning corrective action to recover the supply voltage to its nominal value.

Figure 5:
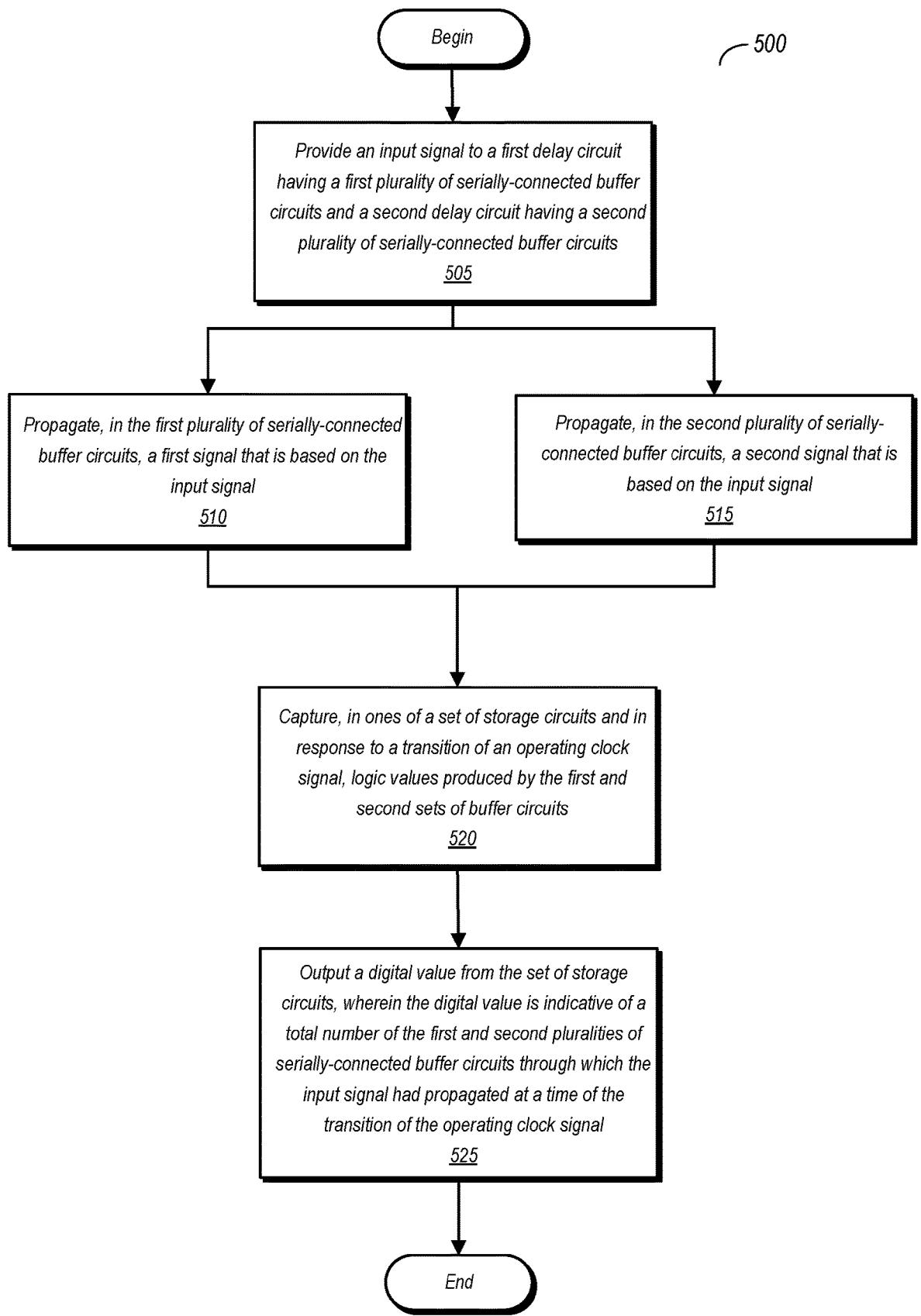
FIG. 5 is a flow diagram of one embodiment of a method for operating a measurement circuit.

Method Flow Diagrams:

FIG. 5 is a flow diagram of one embodiment of a method for operating a measurement circuit. Method 500 may be carried out by any of the various embodiments of a measurement circuit as discussed above. Embodiments of a measurement circuit capable of carrying out Method 500 but not otherwise disclosed herein also fall within the scope of this disclosure.

Method 500 includes providing an input signal to a first delay circuit having a first plurality of serially-connected buffer circuits and a second delay circuit having a second plurality of serially-connected buffer circuits (block 505). The method further includes propagating, in the first plurality of serially-connected buffer circuits, a first signal that is based on the input signal (block 510) and propagating, in parallel and in the second plurality of serially-connected buffer circuits, a second signal that is based on the input signal (block 515). After the signals have propagated in the first and second pluralities of serially-connected buffer circuits, Method 500 further includes capturing, in ones of a set of storage circuits and in response to a transition of an operating clock signal, logic values produced by the first and second sets of buffer circuits (block 520). After capturing the logic values, the method continues with outputting a digital value from the set of storage circuits, wherein the digital value is indicative of a total number of the first and second pluralities of serially-connected buffer circuits through which the input signal had propagated at a time of the transition of the operating clock signal (block 525).

In some embodiments, the method is directed to operating an odd/even embodiment of a measurement circuit. The method in such embodiments includes providing respective input signals to ones of a first subset of the set of storage circuits from the first plurality of serially-connected buffer circuits, and providing respective input signals to ones of a second subset of the set of storage circuits from the second plurality of serially-connected buffer circuits. In operating an odd/even embodiment of the measurement circuit, the method further includes propagating the input signal in the first plurality of serially-connected buffer circuits at a delay relative to the second plurality of serially-connected buffer circuits.

Embodiments are also possible and contemplated in which the method is directed to operating a true/complement embodiment of a measurement circuit. In a true/complement embodiment, the set of storage circuits are differential storage circuits having respective true and complementary inputs. The method of operating the true/complement embodiment includes providing, from ones of the first plurality of serially-connected buffer circuits, respective input signals to the true input of ones of a first subset of the set of storage circuits and providing, from ones of the second plurality of serially-connected buffer circuits, respective input signals to the complementary input of ones of the first subset of the set of storage circuits. The method further includes providing, from ones of the first plurality of serially-connected buffer circuits, respective input signals to the complementary input of ones of a second subset of the set of storage circuits and providing, from ones of the second plurality of serially-connected buffer circuits, respective input signals to the true input of ones of a second subset of the set of storage circuits.

In various embodiments of a measurement circuit, ones of the set of storage circuits include a first clock input and a second clock input, and may operate in a first mode or a second mode. In such embodiments, the method includes providing, from a clock node and during operation in a first mode, a first clock signal as the operating clock signal to respective first clock inputs of ones of the set of storage circuits. During operating in the second mode, the method includes providing, from a vernier clock circuit, a second clock signal to respective second clock inputs of ones of a first subset of storage circuits and providing, from the vernier clock circuit and during operation in the second mode, a third clock signal to respective second clock inputs of ones of a second subset of storage circuits, wherein the second clock signal and the third clock signal are in opposite phases with respect to one another.

In various embodiments, the first signal is an input signal. In such embodiments, the method further comprises generating the second signal, based on the input signal, using an edge alignment circuit, wherein generating the second input signal comprises delaying the input signal such that the first and second signals are opposite in phase with respect to one another.

Figure 6:
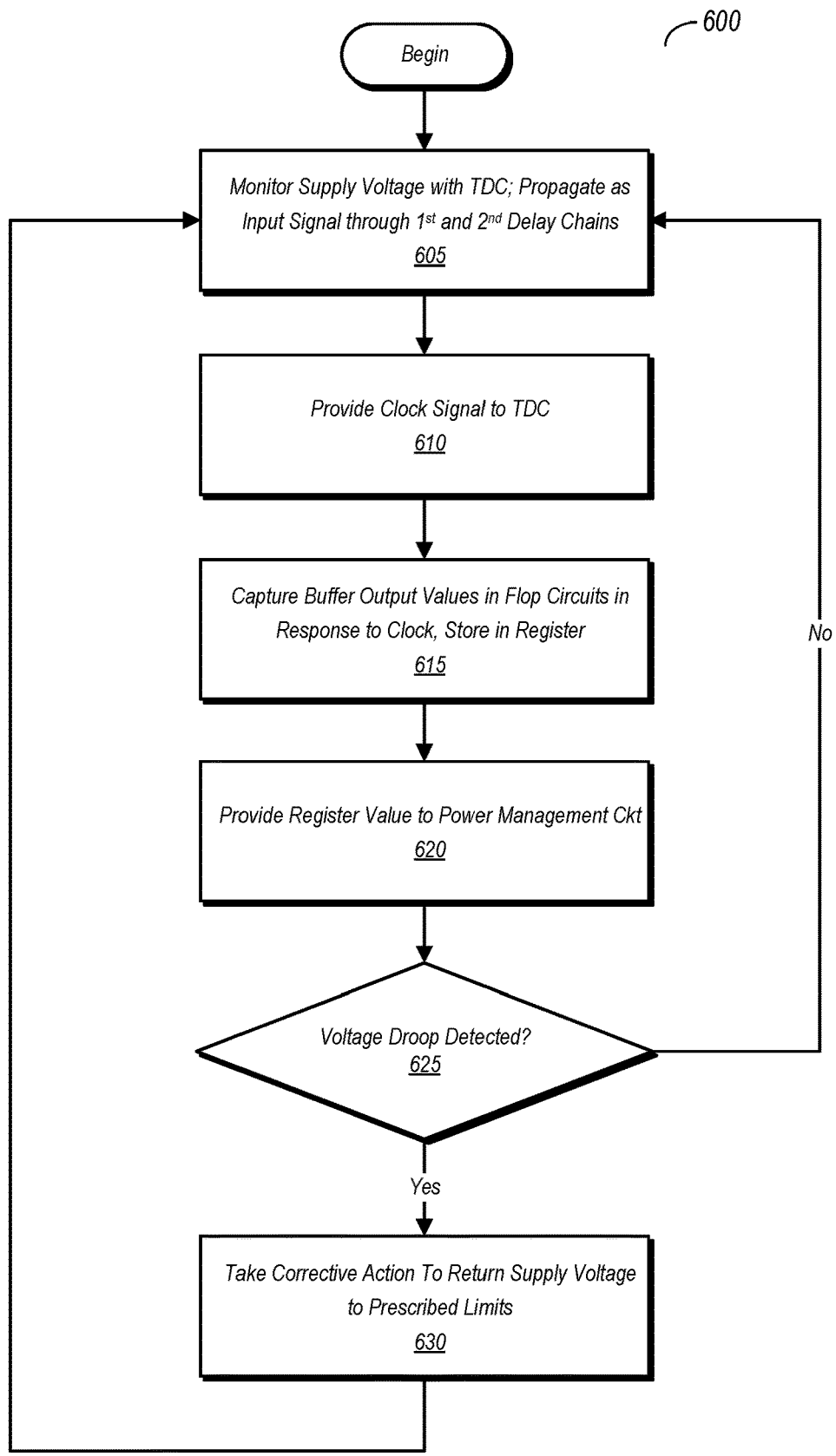
FIG. 6 is a flow diagram of one embodiment of a method for operating a voltage droop detection circuit.

FIG. 6 is a flow diagram of one embodiment of a method for operating a measurement circuit as a time-to-digital converter (TDC) in a voltage droop detection circuit. The method may be carried out using any of the embodiments of a measurement circuit as disclosed herein.

Method 600 includes monitoring a supply voltage using a TDC, which includes propagating an input signal through first and second delay chains of a dual-chain TDC (block 605). At some time thereafter, an active state of a clock signal is provided to the TDC, specifically to the flip-flops thereof (block 610). In response to the clock signal transitioning to the active state (e.g., from low to high), the flip-flops in the TDC capture the output values of the buffer circuits and provide these values to a register (block 615). The captured values, which form a data word that indicates whether or not a voltage droop as occurred, are provided to a power management circuit (block 620).

Based on the data word, the power management circuit may determine if a voltage droop has occurred. If no voltage droop has occurred (block 625, no), the method continues from block 605. If a voltage droop has occurred (block 625, yes), the power management circuit may take corrective action to return the supply voltage to a value within prescribed limits (block 630). Such actions may include, for example, changing the switching frequency of a switching power converter that provides the supply voltage, reducing the frequency of a clock signal provided to circuits of a load of the power converter, temporarily gating the load clock signal, and so on. Such actions may either increase the ability of the power converter to provide current according to the demand by the load and/or reduce the current demanded by the load. Method 600 also returns from block 630 to block 605 to provide continuous monitoring of the supply voltage.

Figure 7:
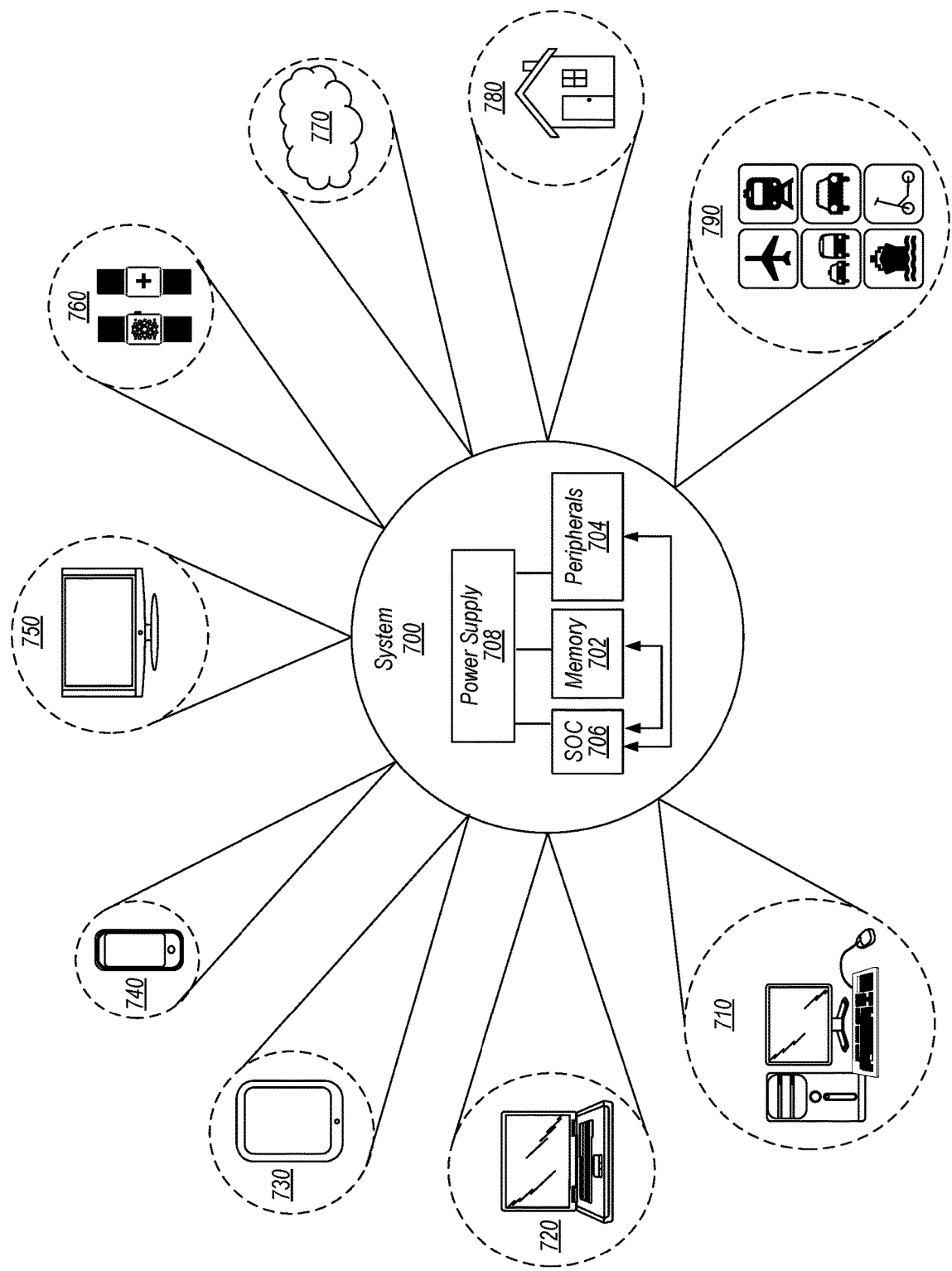
FIG. 7 is a block diagram illustrating one embodiment of an example system.

Example System:

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices. In some embodiments, one or more processors in SoC 706 includes multiple execution lanes and an instruction issue queue. In various embodiments, SoC 706 is coupled to external memory 702, peripherals 704, and power supply 708.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

SoC 706 in the embodiment shown, as well as other integrated circuits implemented in system 700, may include one or more instances of a measurement circuit as disclosed herein. The measurement circuit may be implemented in various applications, such as in a voltage monitoring system similar to that described in reference to FIG. 4.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch 760 may include a variety of general-purpose computing related functions. For example, smartwatch 760 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity]—configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes—various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a measurement circuit, wherein the measurement circuit includes:
   a first delay circuit that includes a first set of serially-connected buffer circuits, wherein the first set of serially-connected buffer circuits are configured to propagate an input signal;
   a second delay circuit connected in parallel with the first delay circuit, wherein the second delay circuit includes a second set of serially-connected buffer circuits configured to propagate the input signal; and a set of storage circuits configured to store logic values produced by the first and second sets of buffer circuits in response to a transition of an operating clock signal; and wherein the measurement circuit is configured to:
use the logic values stored in the set of storage circuits to output a digital value indicative of a total number of serially-connected buffer circuits of the first and second sets of buffer circuits through which the input signal has propagated at a time of the transition of the operating clock signal; and
receive, as the input signal, a supply voltage provided to a functional circuit; and a power management circuit configured to detect a voltage droop in the supply voltage based on the digital value.

2. The apparatus of claim 1, wherein a first subset of the set of storage circuits are coupled to selected ones of the first set of serially-connected buffer circuits and wherein a second subset of the set of storage circuits are coupled to selected ones of the second set of serially-connected buffer circuits, and wherein the first set of serially-connected buffer circuits are configured to propagate the input signal at a delay with respect to the second set of serially-connected buffer circuits.

3. The apparatus of claim 2, wherein ones of the storage circuits are differential flip-flop circuits, wherein ones of the first subset of storage circuits have a first input coupled to an input of a corresponding one of the first set of serially-connected buffer circuits and a second input coupled to an output of the corresponding one of the first set of serially-connected buffer circuits, and wherein ones of the second subset of storage circuit have a first input coupled to an input of a corresponding one of the second set of serially-connected buffer circuits and a second input coupled to an output of the corresponding one of the second set of serially connected buffer circuits.

4. The apparatus of claim 1, wherein ones of the set of storage circuits are differential storage circuits, and wherein ones of a first subset of the differential storage circuits include a true input coupled to the first delay circuit and a complementary input coupled to the second delay circuit, and wherein ones of a second subset of the differential storage circuits includes a true input coupled to the second delay circuit and a complementary input coupled to the first delay circuit.

5. The apparatus of claim 1, wherein ones of the set of storage circuits include a first clock input and a second clock input, and wherein:
during operation in a first mode, ones of the set of storage circuits are configured to receive a first clock signal, on their respective first clock input, as the operating clock signal; and
during operation in a second mode, ones of a first subset of the storage circuits are configured to receive, on their respective second clock input, a second clock signal as the operating clock signal and ones of a second subset of the storage circuits are configured to receive, on their second clock input, a third clock signal as the operating clock signal.

6. The apparatus of claim 5, further comprising a vernier clock circuit having a third delay circuit and a fourth delay circuit, wherein the vernier clock circuit is coupled to receive the second clock signal and is configured to generate the third clock signal that is complementary to and aligned with the second clock signal.

7. The apparatus of claim 6, wherein the third and fourth delay circuits comprise third and fourth sets of serially-connected buffer circuits, respectively, and wherein ones of the third and fourth sets of serially-connected buffer circuits provide less delay than ones of the first and second sets of serially-connected buffer circuits.

8. The apparatus of claim 5, further comprising a control circuit configured to cause the measurement circuit to operate in either the first mode or the second mode.

9. The apparatus of claim 1, further comprising:
a plurality of pairs of cross-coupled inverter circuits coupled between the first set of serially-connected buffer circuits and the second set of serially-connected buffer circuits; and
an edge alignment circuit coupled to the first and second sets of serially-connected buffer circuits, wherein the edge alignment circuit is configured to receive the input signal and further configured to:
generate first and second versions of the input signal based on the input signal, wherein the second version of the input signal is complementary to and aligned with the first version of the input signal.

10. A method comprising:
providing an input signal to a first delay circuit having a first plurality of serially-connected buffer circuits and a second delay circuit having a second plurality of serially-connected buffer circuits;
propagating, in the first plurality of serially-connected buffer circuits, a first signal that is based on the input signal;
propagating, in the second plurality of serially-connected buffer circuits, a second signal that is based on the input signal;
capturing, in ones of a set of storage circuits and in response to a transition of an operating clock signal, logic values produced by the first and second pluralities of serially-connected buffer circuits;
outputting a digital value from the set of storage circuits, wherein the digital value is indicative of a total number of the first and second pluralities of serially-connected buffer circuits through which the input signal had propagated at a time of the transition of the operating clock signal;
receiving, as the input signal, a supply voltage provided to a functional circuit; and
detecting a voltage droop in the supply voltage based on the digital value.

11. The method of claim 10, further comprising:
providing respective input signals to ones of a first subset of the set of storage circuits from the first plurality of serially-connected buffer circuits; and
providing respective input signals to ones of a second subset of the set of storage circuits from the second plurality of serially-connected buffer circuits; and
wherein the method further includes propagating the input signal in the first plurality of serially-connected buffer circuits at a delay relative to the second plurality of serially-connected buffer circuits.

12. The method of claim 10, wherein ones of the set of storage circuits are differential storage circuits having respective true and complementary inputs, and wherein the method further comprises:
providing, from ones of the first plurality of serially-connected buffer circuits, respective input signals to the true input of ones of a first subset of the set of storage circuits;

providing, from ones of the second plurality of serially-connected buffer circuits, respective input signals to the complementary input of ones of the first subset of the set of storage circuits;
providing, from ones of the first plurality of serially-connected buffer circuits, respective input signals to the complementary input of ones of a second subset of the set of storage circuits; and
providing, from ones of the second plurality of serially-connected buffer circuits, respective input signals to the true input of ones of a second subset of the set of storage circuits.

13. The method of claim 10, wherein the first signal is an input signal, wherein ones of the set of storage circuits include a first clock input and a second clock input, and wherein the method further comprises:
providing, from a clock node and during operation in a first mode, a first clock signal as the operating clock signal to respective first clock inputs of ones of the set of storage circuits;
providing, from a vernier clock circuit and during operation in a second mode, a second clock signal to respective second clock inputs of ones of a first subset of storage circuits;
providing, from the vernier clock circuit and during operation in the second mode, a third clock signal to respective second clock inputs of ones of a second subset of storage circuits, wherein the second clock signal and the third clock signal are in opposite phases with respect to one another; and
generating the second signal, based on the input signal, using an edge alignment circuit, wherein the second signal is complementary to and aligned with the first signal.

14. A system comprising:
a voltage droop detection circuit, wherein the voltage droop detection circuit includes a time-to-digital converter (TDC) circuit coupled to receive, as an input signal, a supply voltage provided to one or more functional circuits, wherein the TDC circuit includes:
a first delay circuit having a first set of serially-connected buffer circuits configured to propagate a first signal based on the input signal;
a second delay circuit having a second set of serially-connected buffer circuits configured to propagate a second signal based on the input signal;
a set of storage circuits configured to, in response to a transition of an operating clock signal, store logic values generated by the first and second sets of serially-connected buffer circuits, wherein ones of the set of storage circuits are differential storage circuits having a true input and a complementary input; and
a register circuit coupled to receive the logic values from the set of storage circuits; and
wherein the voltage droop detection circuit is configured to detect a droop in the supply voltage based on a value stored in the register circuit at a time of a transition of the operating clock signal.

15. The system of claim 14, wherein the set of storage circuits includes a first subset of storage circuits and a second subset of storage circuits, wherein true and complementary inputs of ones of the first subset of storage circuits are coupled to an input and an output of a corresponding one of the first set of serially-connected buffer circuits, and wherein true and complementary inputs of ones of the second subset of storage circuits are coupled to an input and an output of a corresponding one of the second set of serially connected buffer circuits.

16. The system of claim 14, wherein the set of storage circuits includes a first subset of storage circuits and a second subset of storage circuits, wherein a one of a first subset of the differential storage circuits include a true input coupled to an output of a first one of the first set of serially-connected buffer circuits and a complementary input coupled to an output of a first one of the second set of serially-connected buffer circuits, and wherein a one of the second subset of storage circuits includes a true input coupled to an output of a second one of the first set of serially-connected buffer circuits and a complementary input coupled to an output of a second one of the second set of serially-connected buffer circuits.

17. The system of claim 14, wherein ones of the set of storage circuits include a first clock input and a second clock input, and wherein, during operation in a first mode, the ones of the set of storage circuits are configured to receive an instance of the operating clock signal on the first clock input, and wherein during operation in a second mode, the ones of the set of storage circuits are configured to receive, via a vernier clock circuit, an instance of the operating clock signal on the second clock input.

18. The system of claim 14, further comprising one or more inverter pairs coupled between the first set of serially-connected buffer circuits and the second set of serially-connected buffer circuits.

19. The apparatus of claim 1, wherein the power management circuit is further configured to detect a change in the digital value between a first cycle and a second cycle, wherein the change in the digital value indicates the voltage droop attributable to the functional circuit, and wherein the digital value is stored in a memory.

20. The apparatus of claim 19, wherein, in response to detection of the voltage droop, the power management circuit is further configured to initiate an action to rectify the voltage droop.

* * * * *